(12) United States Patent
Peng et al.

(10) Patent No.: US 9,389,245 B2
(45) Date of Patent: Jul. 12, 2016

(54) SWITCH CONTROL UNIT, TEST APPARATUS AND METHOD FOR LIQUID CRYSTAL CELL

(71) Applicant: BEIJING BOE OPTOELECTRONICS TECHNOLOGY CO., LTD., Beijing (CN)

(72) Inventors: Zhilong Peng, Beijing (CN); Xiangfei He, Beijing (CN); Chunbae Park, Beijing (CN); Wei Wang, Beijing (CN)

(73) Assignee: BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 209 days.

(21) Appl. No.: 13/949,852

(22) Filed: Jul. 24, 2013

(65) Prior Publication Data
US 2013/0307575 A1 Nov. 21, 2013

Related U.S. Application Data

(62) Division of application No. 12/574,833, filed on Oct. 7, 2009, now Pat. No. 8,525,540.

(30) Foreign Application Priority Data

Oct. 9, 2008 (CN) .......................... 2008 1 0223735

(51) Int. Cl.
*G01R 31/26* (2014.01)
*G01R 1/20* (2006.01)
(Continued)

(52) U.S. Cl.
CPC *G01R 1/20* (2013.01); *G09G 3/006* (2013.01); *G09G 3/3688* (2013.01)

(58) Field of Classification Search
CPC ................ G09G 3/006; G09G 3/3648; G09G 2300/0426; G02F 1/1309; G02F 1/136259; G02F 2001/136254
USPC .......................... 324/760.01, 760.02; 345/50
See application file for complete search history.

(56) References Cited

U.S. PATENT DOCUMENTS

| 5,122,791 A | 6/1992 | Gibbons et al. |
| 5,363,037 A | 11/1994 | Henley et al. |

(Continued)

FOREIGN PATENT DOCUMENTS

| CN | 1494047 A | 5/2004 |
| CN | 101206323 A | 6/2008 |

(Continued)

OTHER PUBLICATIONS

Japanese Office Acton dated Apr. 30, 2014; Appln. No. JP2009-232422.

(Continued)

*Primary Examiner* — Tung X Nguyen
*Assistant Examiner* — Thang Le
(74) *Attorney, Agent, or Firm* — Ladas & Parry LLP

(57) ABSTRACT

The present invention discloses a switch control unit, a test apparatus and method for a liquid crystal cell. The switch control unit controls a signal input to the liquid crystal display driver and controls the output of the signal from the liquid crystal display driver accordingly, and includes a control signal generator and a switch module. The test apparatus for the liquid crystal cell comprises: a switch control unit connected with a gate driver, for controlling ON and OFF of a signal input to the gate driver and controlling ON and OFF of a gate scan signal accordingly. The test method for the liquid crystal cell comprises: inputting a test signal; controlling ON and OFF of a gate scan signal by controlling ON and OFF of a signal input to a gate driver so as to determine the badness positions on a screen.

6 Claims, 7 Drawing Sheets

(51) Int. Cl.
*G09G 3/00* (2006.01)
*G09G 3/36* (2006.01)

(56) References Cited

U.S. PATENT DOCUMENTS

| | | | | |
|---|---|---|---|---|
| 5,576,730 | A * | 11/1996 | Shimada et al. | 345/98 |
| 5,585,815 | A * | 12/1996 | Nakashima | G02F 1/1345 |
| | | | | 345/100 |
| 5,877,736 | A * | 3/1999 | Imajo | G09G 3/2011 |
| | | | | 345/89 |
| 6,525,556 | B2 | 2/2003 | Matsueda | |
| 6,930,664 | B2 | 8/2005 | Kim et al. | |
| 7,151,384 | B2 * | 12/2006 | Ueno | G09G 3/006 |
| | | | | 324/713 |
| 7,889,167 | B2 * | 2/2011 | Kim | G09G 3/3614 |
| | | | | 345/204 |
| 7,911,217 | B2 | 3/2011 | Nam | |
| 7,978,903 | B2 * | 7/2011 | Kojima | G06T 7/0004 |
| | | | | 348/246 |
| 8,368,417 | B2 * | 2/2013 | Li | G02F 1/1309 |
| | | | | 324/760.01 |
| 2001/0052788 | A1 | 12/2001 | Tomita | |
| 2002/0154108 | A1 * | 10/2002 | Nara | G09G 3/006 |
| | | | | 345/204 |
| 2006/0139293 | A1 * | 6/2006 | Cho | 345/100 |
| 2006/0279313 | A1 | 12/2006 | Fujita et al. | |
| 2007/0126678 | A1 | 6/2007 | Shih et al. | |
| 2007/0126679 | A1 | 6/2007 | Oh et al. | |
| 2007/0126975 | A1 * | 6/2007 | Choi | G02F 1/1309 |
| | | | | 349/192 |
| 2007/0182441 | A1 * | 8/2007 | Hwang | 324/770 |
| 2007/0200589 | A1 | 8/2007 | Jeong et al. | |
| 2007/0236243 | A1 | 10/2007 | Park et al. | |
| 2007/0291198 | A1 | 12/2007 | Shen | |
| 2008/0036715 | A1 | 2/2008 | Lee et al. | |
| 2008/0150856 | A1 | 6/2008 | Nam | |
| 2008/0309605 | A1 * | 12/2008 | Jang et al. | 345/92 |
| 2009/0295779 | A1 * | 12/2009 | Yanagi | G09G 3/3677 |
| | | | | 345/213 |
| 2013/0082990 | A1 * | 4/2013 | Her et al. | 345/206 |

FOREIGN PATENT DOCUMENTS

| | | |
|---|---|---|
| JP | 08-062572 A | 3/1996 |
| JP | 2003-207756 A | 7/2003 |
| JP | 2003-233356 A | 8/2003 |
| JP | 2004-061782 A | 2/2004 |
| KR | 20070001373 A | 1/2007 |
| KR | 20070079181 A | 8/2007 |
| TW | 573127 B | 1/2004 |

OTHER PUBLICATIONS

Qu Huiming; "Study of Defect Test for TFT-LCD Panel", Optoelectronic Technology Feb. 1997; 9 pages.

Japanese Office Action Jun. 18, 2013; Application No. JP2009-232422.

KIPO NOA dated Oct. 29, 2012; Appln. No. 10-2012-0007337.

USPTO RR dated Aug. 8, 2012 inconnection with U.S. Appl. No. 12/574,833.

USPTO NFOA dated Oct. 26, 2012 inconnection with U.S. Appl. No. 12/574,833.

USPTO NOA dated Apr. 18, 2013 inconnection with U.S. Appl. No. 12/574,833.

* cited by examiner

SWITCH CONTROL UNIT, TEST APPARATUS AND METHOD FOR LIQUID CRYSTAL CELL

BACKGROUND

The present invention relates to a field of manufacturing liquid crystal display, and particularly to a liquid crystal cell test.

At present, liquid crystal cell tests for TFT-LCD (Thin Film Transistor-Liquid Crystal Display) are mostly focused on realizing different test pictures by changing data signals, the purpose of which is to make various badness of liquid crystal display panels all in a special test picture, so that positions in which the badness are located are tested and determined by eyeballing of an operator. However, this test means in which different test pictures are realized by only changing data signals does not think much of the important sense of the gate scan signal in testing, and thus many defects of the liquid crystal display panel, such as short circuit badness of data line and gate scan line or the like, can not be fully displayed on the test pictures. Therefore, this test means can not completely reflect badness phenomena, and it is difficult for the operator to obtain exact coordinate information of the badness positions, which renders great difficulty in maintaining, analyzing and improving.

The gate scan signal is carried by the gate scan line. In a same picture, a TFT turned-on voltage is output by the gate scan line of a certain row only once for about 10-30 μs, the voltage value thereof is usually 15 to 30 Volts, and the gate scan line is in a state of outputting the gate scan signal being turned off for the rest time, the voltage value thereof is usually −3 to −10 Volts. A signal voltage carried by the data line is picture information to be displayed, which generally is about 0-15 volts. For example, in a normally white mode of the picture, a signal voltage with a maximum absolute value with respect to a voltage of a common electrode represents black picture information.

The short circuit badness of the data line and gate scan line is an interference problem caused by electrical short circuit, and is referred to as a DGS (Data Gate Short Circuit) badness. The data line in which a DGS badness locates is controlled by gate scan line OFF signal (negative voltage signal) for most time, and thus a voltage grads is formed along the data line direction, which is minimum at a crossing point of the short circuit.

As shown in FIG. 1, at present, a test apparatus for a liquid crystal cell comprises a test signal generator 200, a direct current module 300, a timing controller 400 connected with the test signal generator 200, a gate driver 500 connected with the direct current module 300 and the timing controller 400, and a source driver 600 connected with the timing controller 400. In the test, the test signal generator 200 generates a test signal and outputs it to the timing controller 400; the direct current module 300 generates a high level signal and a low level signal; the gate driver 500 modulates the high and low level signals with a frame-on control signal generated by the timing controller 400 so as to output a gate scan signal; the timing controller 400 outputs a gray scale picture signal at the same time, and drives pixel units through the source driver 660. Therefore, a picture of test result can be displayed on the screen.

As shown in FIG. 2, in a post-assembly test, for a conventional L0 test picture for example, a line with gradually changed brightness appears on the short-circuit data line due to the voltage grads formed along the direction of the data line in which the DGS badness locate, but the position of the badness is not clear. When outputting a turning-on signal, the voltage of the gate scan line in which the DGS badness locate drops due to the influence of the gray scale picture signal on the data line, which renders the charging current of all the TFTs in that gate scan line declines, i.e. insufficient charging; whereas when outputting a turning-off signal, the voltage of the gate scan line rises up due to the influence of the gray scale picture signal on the data line, which renders an increase of the turning-off current of all the TFTs in that gate scan line, that is, the turning-off current can not be maintained. However, although the respective pixel electrode voltages are influenced by the short circuit of the gate scan line and data line, in a normal progressive scan process, the influence can not be clearly displayed and recognized by the operator as compared with neighbor lines. Accordingly, the crossing point of the questionable gate scan line and data line can not be determined, that is, the position of the DGS badness is not clear.

SUMMARY

The present invention provides a switch control unit capable of controlling a signal input to the liquid crystal display driver so as to control the output of signal from the liquid crystal display driver.

An embodiment of the present invention utilizes the following technical solution. A switch control unit for controlling a signal input to a liquid crystal display driver so as to control output of a signal from the liquid crystal display driver, comprising: a control signal generator and a switch module connected with said control signal generator. Said control signal generator is used for generating a periodic control signal; and said switch module is used for controlling the signal input to the liquid crystal display driver in accordance with said control signal, and controlling the output of the signal from the liquid crystal display driver accordingly.

By disposing the control signal generator and the switch module, the switch control unit of present invention controls the signal input to the liquid crystal display driver by using the periodic control signal generated by the control signal generator, thereby controlling the output of the signal from the liquid crystal display driver.

The present invention also provides a test apparatus for a liquid crystal cell, which is capable of testing badness positions of a liquid crystal display panel.

An embodiment of the present invention utilizes the following technical solution. A test apparatus for a liquid crystal cell, comprising: a test signal generator, a direct current module, a timing controller connected with said test signal generator, a gate driver connected with said direct current module and said timing controller, a source driver connected with said timing controller, and a switch control unit connected with said gate diver. Said test signal generator is used for generating a test signal; said direct current module is used for generating a high level signal and a low level signal, said timing controller is used for generating a frame-on control signal and a gray scale picture signal in accordance with the test signal; said gate driver is used for generating a gate scan signal under the control of said frame-on control signal and said high and low level signals; said source driver is used for driving pixel units in the liquid crystal cell with said gray scale picture signal; and said switch control unit is used for controlling ON and OFF of the signal input to said gate driver and controlling ON and OFF of the gate scan signal accordingly.

The present invention can test badness positions of the liquid crystal display panel on the screen by disposing a test signal generator, a direct current module, a timing controller connected with said test signal generator, a gate driver connected with said direct current module and said timing controller and a source driver connected with said timing controller and further disposing a switch controlling unit connected with said gate diver, which is used for controlling ON and OFF of the signal input to said gate driver so as to control ON and OFF of the gate scan signal output by said gate driver.

The present invention also provides a test method for a liquid crystal cell, which is capable of testing badness positions of a liquid crystal display panel.

An embodiment of the present invention utilizes the following technical solution. A test method for a liquid crystal cell, comprising: inputting a testing signal; and controlling ON and OFF of a gate scan signal by controlling ON and OFF of a signal input to a gate driver, whereby badness positions on a screen are determined.

The test method for the liquid crystal cell provided in the present invention is capable of testing badness positions of a liquid crystal display panel on a screen by inputting a test signal, controlling ON and OFF of a signal input to a gate driver and controlling ON and OFF of a gate scan signal accordingly.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

The test apparatus and method for a liquid crystal cell according to the present invention will be described in detail with reference to drawings.

The present invention provides a switch control unit capable of controlling a signal input to the liquid crystal display driver so as to control output of a signal from the liquid crystal display driver.

Figure 1:
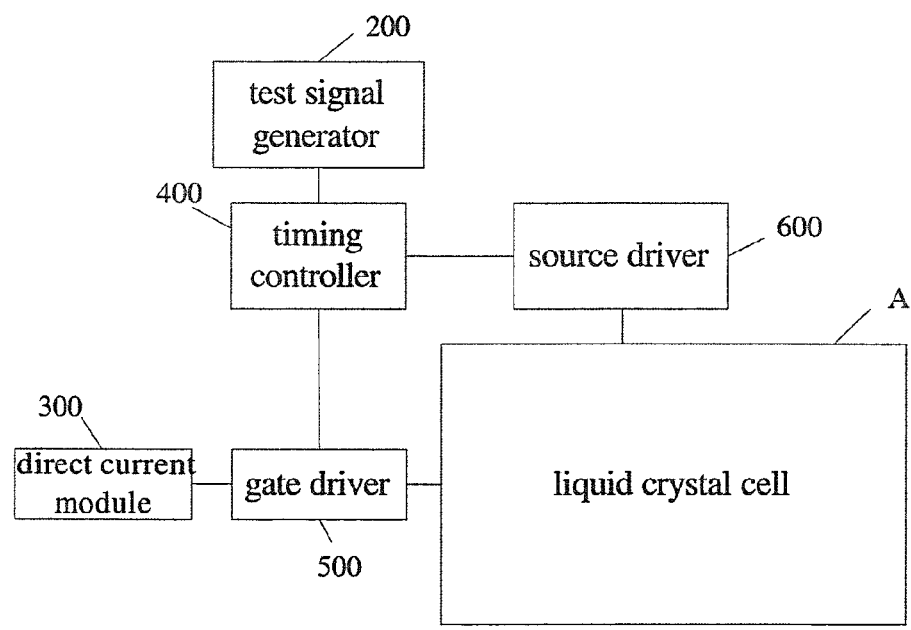
FIG. 1 is a schematic diagram of a test apparatus for a liquid crystal cell in prior art.
Figure 2:
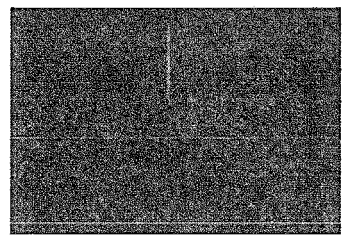
FIG. 2 is a picture displayed when testing DGS badness for the L0 gray scale picture after the liquid crystal cell assembly in prior art.
Figure 3:
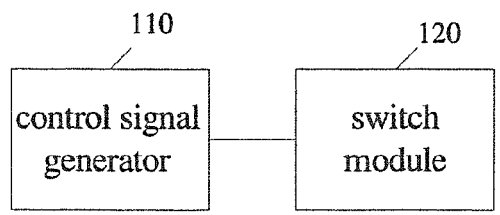
FIG. 3 is a schematic diagram of a switch control unit of the present invention.

As shown in FIG. 3, a switch control unit according to the present invention is used for controlling a signal input to a liquid crystal display driver, thereby controlling the output of the signal from the liquid crystal display driver. The switch control unit comprises: a control signal generator 110 and a switch module 120 connected with said control signal generator 110.

Said control signal generator 110 is used for generating a periodic control signal; and said switch module 120 is used for controlling the signal input to the liquid crystal display driver in accordance with said control signal, thereby controlling the output of the signal from the liquid crystal display driver.

By setting the control signal generator and the switch module, the switch control unit according to the present invention controls the signal input to the liquid crystal display driver by using the periodic control signal generated by the control signal generator, thereby the output of the signal from the liquid crystal display driver is controlled.

Embodiment 1 of the Switch Control Unit

The switch control unit of the embodiment is applied to an output control of a gate driver signal. The switch control unit controls ON and OFF of a gate scan signal output by said gate driver by controlling ON and OFF of a frame-on signal input to the gate driver.

Figure 4:
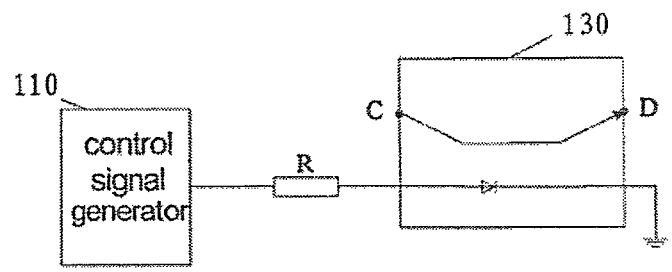
FIG. 4 is a schematic diagram of embodiment 1 of a switch control unit according to the present invention.

As shown in FIG. 4, the switch control unit of the embodiment includes a control signal generator 110 and a photosensitive switch 130 connected with the control signal generator 110, and a protection resistance is disposed between the control signal generator 110 and the photosensitive switch 130. The photosensitive switch 130 also has a terminal grounded. A terminal C of the photosensitive switch 130 is connected to a timing controller when used, so that a signal input to the photosensitive switch from the terminal C is a frame-on control signal, for example V2 shown in FIG. 7.

Figure 7:
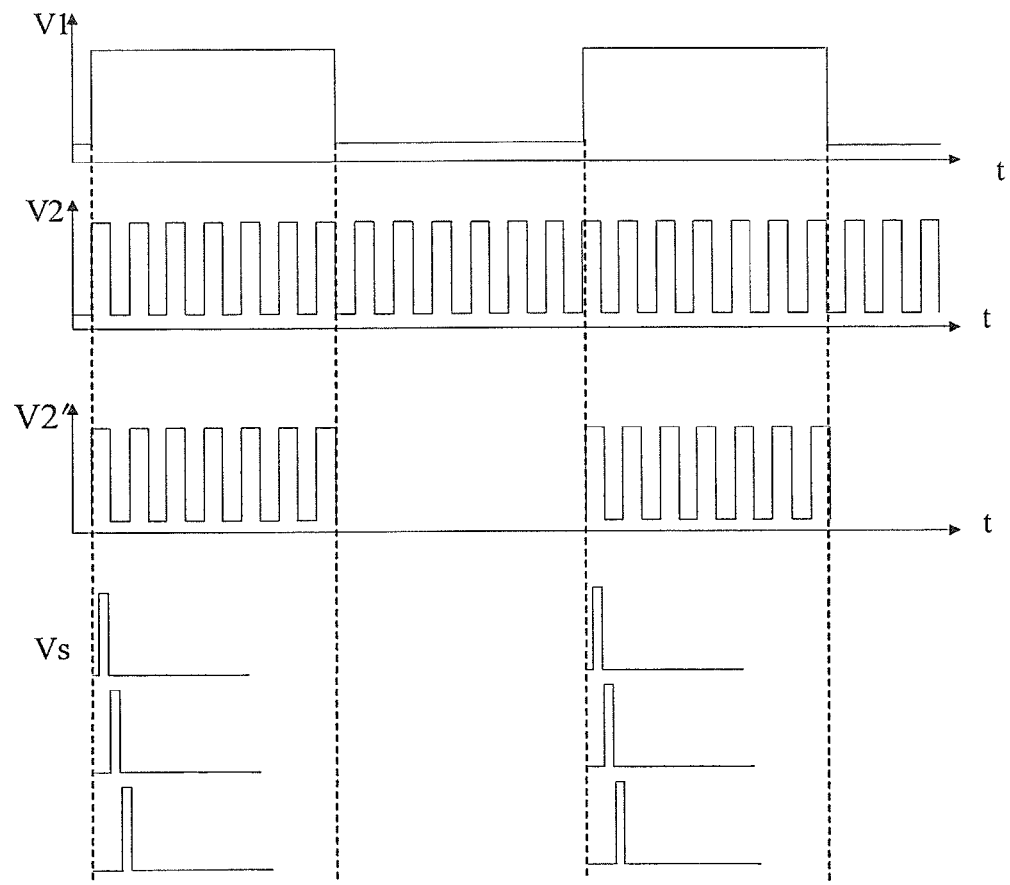
FIG. 7 is a signal schematic diagram of embodiment 1 of the test apparatus for the liquid crystal cell according to the present invention.

As shown in FIG. 7, the control signal generator 110 is used for generating a square wave signal V1. The photosensitive switch 130 controls ON and OFF of the frame-on signal V2 in accordance with V1. When the square wave signal V1 is at high level, the frame-on signal V2 is controlled to be output from a terminal D; when the square wave signal V1 is at a low level, the frame-on signal V2 is controlled to be turned-off, and thus the terminal D has no output. The signal subjected to a control and input to the gate driver is V2' as shown in FIG. 7, and $V_S$ is a gate scan signal output from the gate driver to each of the gate scan lines. Therefore, the gate scan signal output from the gate driver can be controlled to be turned on or off.

The switch control unit of the embodiment can also be applied to an output control for a source driver signal, and ON and OFF of a signal output from said source driver is controlled by controlling ON and OFF of a signal input to the source driver.

Embodiment 2 of the Switch Control Unit

The switch control unit of the embodiment is applied to an output control of a gate driver signal. A high level signal and a low level signal generated by the direct current module and a frame-on control signal are input to the gate driver, thereby a gate scan signal can be generated. The switch control unit of the embodiment controls ON and OFF of the high level signal and low level signal input to the gate driver and generated by the direct current module, thereby controlling ON and OFF of the gate scan signal output from the gate driver.

Figure 5:
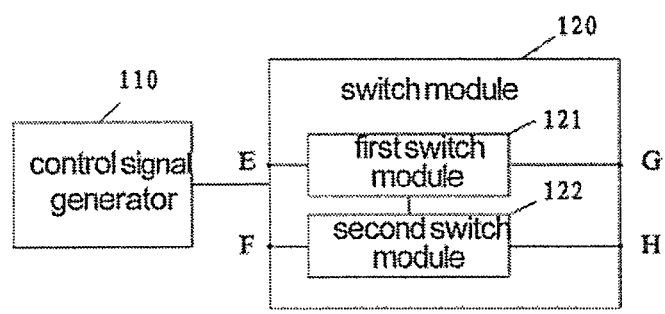
FIG. 5 is a schematic diagram of embodiment 2 of a switch control unit according to the present invention.

As shown in FIG. 5, the switch control unit of this embodiment includes a control signal generator 110 and a switch module 120 connected with the control signal generator 110. In particular, the switch module 120 comprises a first switch module 121 and a second switch module 122.

Figure 12:
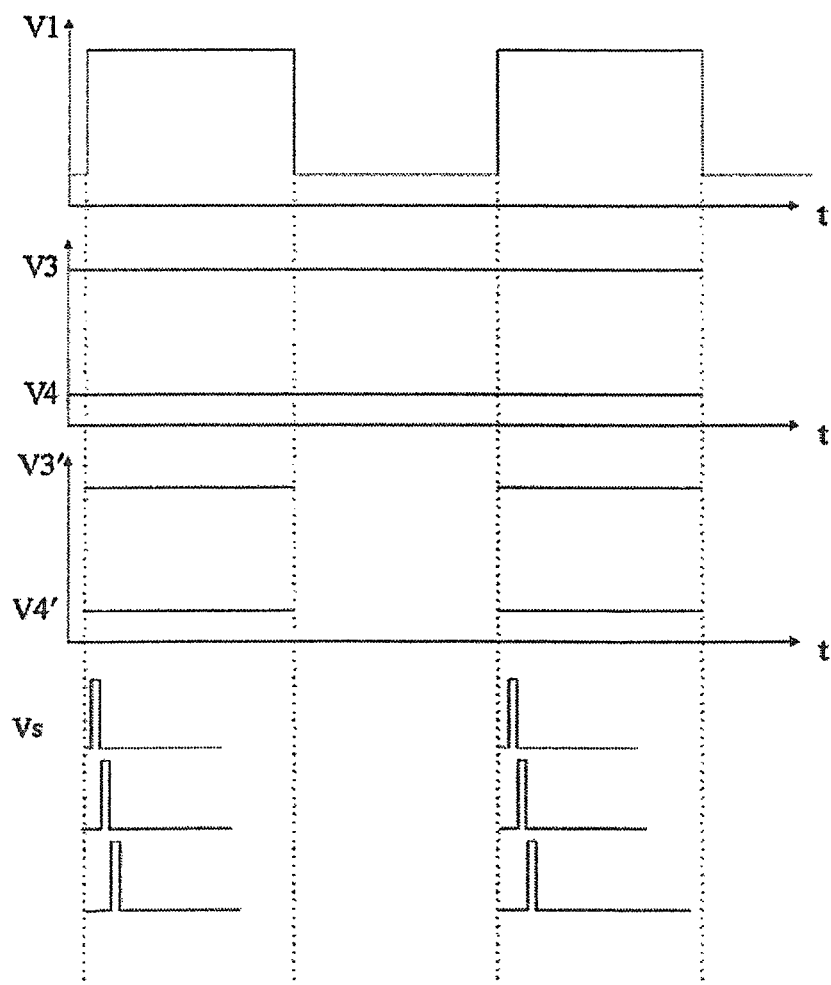
FIG. 12 is a schematic signal diagram of embodiment 2 of the test apparatus for the liquid crystal cell according to the present invention.

As shown in FIG. 12, the control signal generator 110 generates a square wave signal V1. A terminal E of the first switch module 121 is connected with a high level output terminal of the direct current module, a terminal F of the second switch module 122 is connected with a low level output terminal of the direct current module. The high level signal and low level signal output by the direct module are V3 and V4 as shown in FIG. 12. When the square wave signal V1 is at high level, the first switch module 121 controls V3 to be output from a terminal G, and the second switch module 122 controls V4 to be outputted from a terminal H; when the square wave signal V1 is at low level, the first and second switch modules 121 and 122 respectively control terminals G and H to make them has no output signal. Under the control of switch module 120, the signals output from terminals G and H are V3' and V4' as shown in FIG. 12, and $V_S$ is the gate scan signal output from the gate driver to each of the gate scan lines. Therefore, the gate scan signal output from the gate driver can be controlled to be turned on or off.

As there are so many signals are input to the source driver from the timing controller, the switch control unit provided in the embodiment can intentionally select two types of signals to control, so as to control the output of the source driver signal.

The switch control unit of the present invention sets a control signal generator for generating a square wave signal and a switch module for controlling a signal input to the liquid crystal display driver in accordance with the square wave signal so as to control the output of the signal from the liquid crystal display driver. When the apparatus is connected to the gate driver of the liquid crystal cell, it is possible to control ON and OFF of the frame-on signal input to the gate driver or the high and low level signals generated by the direct current module, thereby controlling ON and OFF of the gate scan signal. When the apparatus is connected to the source driver of the liquid crystal cell, it is possible to control ON and OFF of a signal input to the source driver, thereby controlling ON and OFF of a signal output from the source driver. By controlling the output of signals from the gate driver or source driver, the present invention can be applied to the liquid crystal cell test and test positions or types of the badness in the liquid crystal display panel.

The present invention also provides a test apparatus for a liquid crystal cell, comprising: a test signal generator, a direct current module, a timing controller connected with said test signal generator, a gate driver connected with said direct current module and said timing controller, a source driver connected with said timing controller, and a switch controlling unit connected with said gate diver.

Said test signal generator is used for generating a test signal; said direct current module is used for generating a high level signal and a low level signal; said timing controller is used for generating a frame-on control signal and a gray scale picture signal in accordance with the test signal; said gate driver is used for generating a gate scan signal under the control of said frame-on control signal and said high and low level signals; said source driver is used for driving pixel units in the liquid crystal cell with said gray scale picture signal; and said switch control module is used for controlling ON and OFF of a signal input to said gate driver so as to control ON and OFF of the gate scan signal.

The present invention can test badness positions of the liquid crystal display panel on the screen by providing a test signal generator, a direct current module, a timing controller connected with said test signal generator, a gate driver connected with said direct current module and said timing controller and a source driver connected with said timing controller and by further providing a switch controlling unit connected with said gate diver, which is used for controlling ON and OFF of the signal input to said gate driver so as to control ON and OFF of the gate scan signal.

Embodiment 1 of a Test Apparatus

Figure 6:
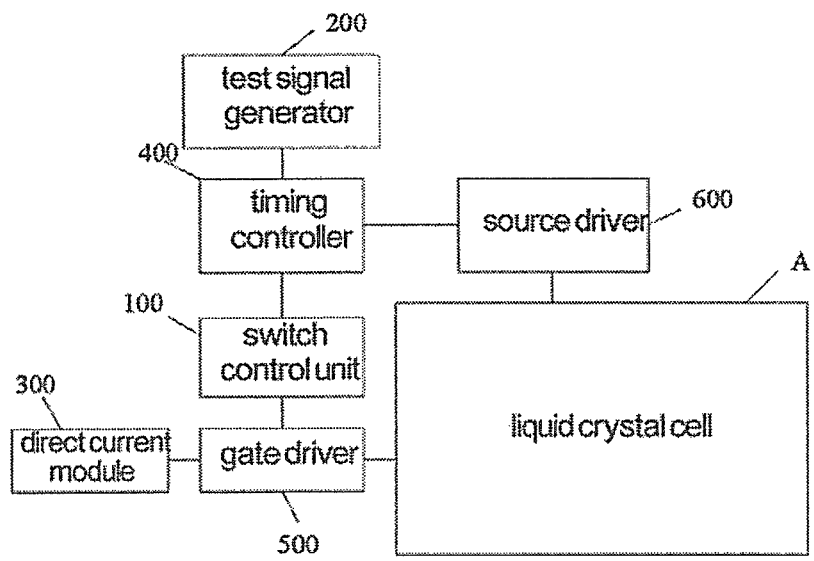
FIG. 6 is a schematic diagram of embodiment 1 of a test apparatus for a liquid crystal cell according to the present invention.

As shown in FIG. 6, a test apparatus for a liquid crystal cell according to the present application includes a test signal generator 200, a direct current module 300, a timing controller 400 connected with the test signal generator 200, a gate driver 500 connected with the direct current module 300 and the timing controller 400, a source driver 600 connected with the timing controller 400 and a switch control unit 100 connected between the timing controller 400 and the gate driver 500. An output terminal of the gate driver is connected to a gate scan line of the liquid crystal cell A, and an output terminal of the source driver 600 is connected to a data line of the liquid crystal cell A.

Said test signal generator 200 is used for generating a test signal; said direct current module 300 is used for generating a high level signal and a low level signal; said timing controller 400 is used for generating a frame-on control signal and a gray scale picture signal in accordance with the test signal; said gate driver 500 is used for generating a gate scan signal under the control of said frame-on control signal and said high and low level signals; said source driver 600 is used for driving pixel units in the liquid crystal cell with said gray scale picture signal; and said switch control module 100 is used for controlling ON and OFF of the signal input to said gate driver thereby controlling ON and OFF of the gate scan signal.

As shown in FIG. 4, in the present embodiment, the switch control unit 100 includes a control signal generator 110 and a photosensitive switch 130.

The control signal generator 110 is used for generating a periodic square wave signal, and the cycle thereof is larger than that of the frame-on control signal. As shown in FIG. 7, V1 is a square wave signal, V2 is a frame-on control signal, and the cycle of V1 is larger than that of V2.

A terminal C of the photosensitive switch 130 is connected to the timing controller 400, and a terminal D of the photosensitive switch 130 is connected to the gate driver 500. The photosensitive is also connected with said control signal generator 110 through a protection resistance R, and has a terminal grounded.

When the square wave signal V1 is at high level, the photosensitive switch 130 controls the frame-on signal V2 to be input to the gate driver 500 from terminal D; when the square wave signal V1 is at low level, the photosensitive switch 130 controls the frame-on control signal V2 to be turned off. As shown in FIG. 5, V2' is a signal input to the gate driver 500 through the switch control unit 100, and $V_S$ is a gate scan signal output from the gate driver 500 to each of the gate scan lines.

The principle of present embodiment is explained below. If there is a DGS badness in the liquid crystal display panel of the liquid crystal cell, and a L0 gray scale picture signal is adopted to perform a test, then a picture as shown in the left figure of FIG. 8 will appear during the test, wherein a line with a gradually changed brightness represents a position of a data line in which the DOS badness locates. When the gate driver is controlled by the switch control unit such that no gate scan signal is output to external therefrom, since TFTs of respective pixels are in a turned-off state, the pixel electrodes can not be charged or discharged and thus are in a maintained state. The voltage of the gate scan line in which the DOS badness locates rises up due to the influence of the short circuit of the data line, which causes the TFT in that line turned on partially and the leak current is larger than that in the neighbor pixel units. Accordingly, a white or offwhite line or gradually changed white or offwhite line will be formed, as shown in the right figure of FIG. 8. Due to the periodic control by the control unit and a visual staying phenomenon, a bright line in a longitudinal direction and a white line in a transverse direction can be seen on the screen at the same time. Now, the operator can find the positions of DGS badness by determining the abscissa of the bright line in the longitudinal direction and the ordinate of the white line in the transverse direction or using other locating means.

Figure 9:
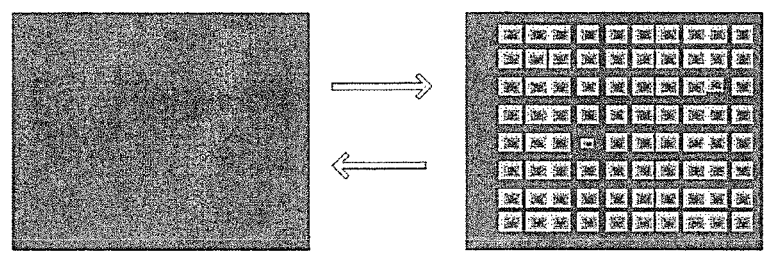
FIG. 9 is picture displayed when testing "chessboard Mura" badness for the L127 gray scale picture in embodiment 1 of the test apparatus for the liquid crystal cell according to the present invention.

Moreover, a nonuniformity problem of the picture, including a picture nonuniformity due to the nonuniform cell thickness caused in the assembly process, a nonuniformity of the picture due to the characteristic differences for TFTs in respective pixels caused by array substrate integrate circuit process, a nonuniformity of the picture due to the capacitance differences for respective pixel and so on, is one of the primary quality problems. All these quality problems of the liquid crystal display panel can not be simply distinguished by existing test method for the liquid crystal cell, and the badness need to be strengthened so as to be recognized by human eyes. For example, as for a "chessboard Mura" badness of the liquid crystal display panel, the embodiment 1 of the test apparatus according to the present invention can also be used in the test. For example, a L127 gray scale picture signal is used to perform the test, a test result displayed on the screen after inputting the test signal is as shown in the left figure of FIG. 9; and when the gate scan signal is controlled to be turned off by the switch control unit, the test result on the screen is as shown in the right figure of FIG. 9. By controlling the gate scan signal to be turned off periodically, the positions of the "chessboard Mura" badness can be fairly determined as a result of the alternation of the pictures in the left and right figures and the visual staying phenomenon. Since different badness of the liquid crystal display panel show different pictures on the screen, the test apparatus for the liquid crystal cell according to the present invention can distinguish the liquid crystal display panel badness of different types.

Embodiment 2 of the Test Apparatus

Figure 10:
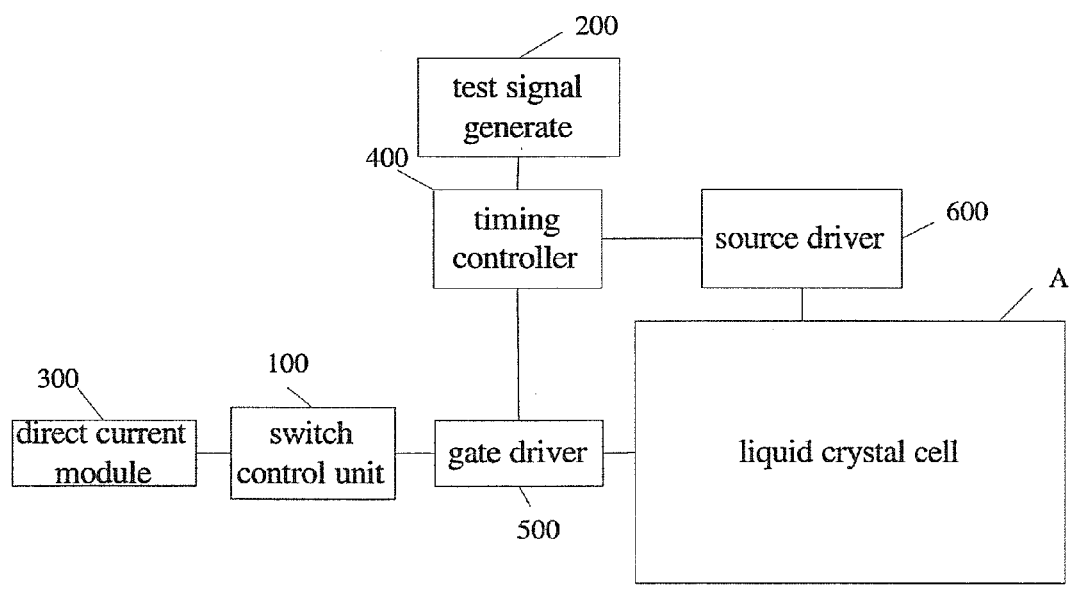
FIG. 10 is a schematic diagram of embodiment 2 of a test apparatus for a liquid crystal cell according to the present invention.

The structure diagram of the embodiment is as shown in FIG. 10. The embodiment different from embodiment 1 of the test apparatus lies in that the switch control unit 100 is connected between the direct current module 300 and the gate driver 500, so as to periodically control a high level signal and a low level signal generated by the direct current module 300 to be input to the gate driver 500 or to be turned off.

Figure 11:
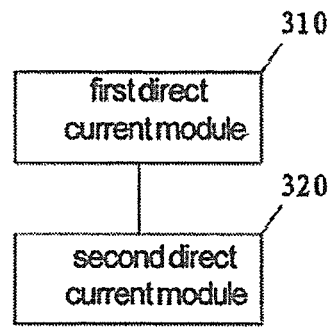
FIG. 11 is a schematic diagram of a direct current module in embodiment 2 of the test apparatus for the liquid crystal cell according to the present invention.

As shown in FIG. 11, the direct current module 300 includes a first direct current module 310 for generating a high level signal and a second direct current module 320 for generating a low level signal.

As shown in FIG. 5, the switch control unit 100 includes a control signal generator 110 and a switch module 120. The switch module 120 is connected between the direct current module 300 and the gate driver 500. The switch module 120 comprises a first switch module 121 connected to the first direct current module 310 through a terminal E and a second switch module 122 connected to the second direct current module 320 through a terminal F.

As shown in FIG. 12, V1 is a square wave signal generated by the control signal generator 110, V3 and V4 are the high and low level signals input to the gate driver 500. The first switch module 121 is used for controlling ON and OFF of the high level signal V3 in accordance with the square wave signal V1, and the second switch module 122 is used for controlling ON and OFF of the low level signal V4 in accordance with the square wave signal V1. V3' and V4' are signals input from terminals G and H to the gate driver 500 through the switch control unit 100, and $V_S$ is a gate scan signal output from the gate driver 500 to each of the gate scan lines.

The present embodiment can implement the DOS badness test in embodiment 1 of the test apparatus by controlling ON and OFF of the signal input to the gate driver and thereby controlling ON and OFF of the gate scan signal.

The present embodiment of the invention can display badness positions on the test picture by providing a test signal generator, a direct current module, a timing controller, a gate driver connected with said direct current module and said timing controller, a source driver connected with said timing controller and a switch controlling unit connected between said timing controller and said gate diver or connected between said direct current module and said gate driver, wherein the switch controlling unit is used for controlling ON and OFF of the signal input to said gate driver and thereby controlling ON and OFF of the gate scan signal. Preferably, when the switch control unit is connected between said timing controller and said gate diver in this embodiment, the badness types of the liquid crystal display panel can also be tested. Since badness of different types will show different pictures on the screen, the present invention can also test the badness of other types in the liquid crystal display panel.

The present invention also provides a test method for a liquid crystal cell, which is capable of testing badness positions of a liquid crystal display panel.

Figure 13:
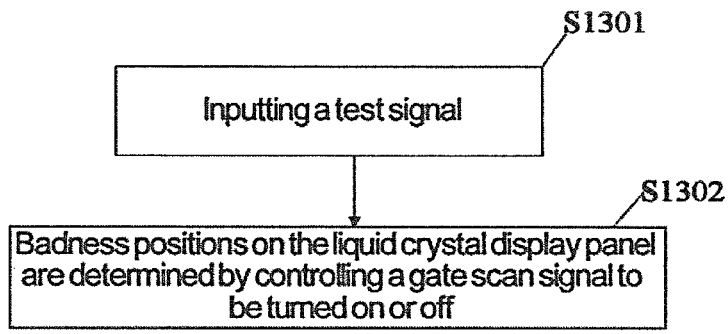
FIG. 13 is a flowchart of a test method for a liquid crystal cell according to the present invention.

As shown in FIG. 13, the test method for the liquid crystal cell in present embodiment comprising:

S1301, inputting a test signal; and

S1302, controlling ON and OFF of a gate scan signal by controlling ON and OFF of a signal input to a gate driver, thereby determining badness positions on a screen.

The present invention is capable of testing badness positions in a liquid crystal display panel by inputting a test signal and controlling ON and OFF of a signal input to a gate driver thereby controlling ON and OFF of a gate scan signal.

Method Embodiment 1

Figure 14:
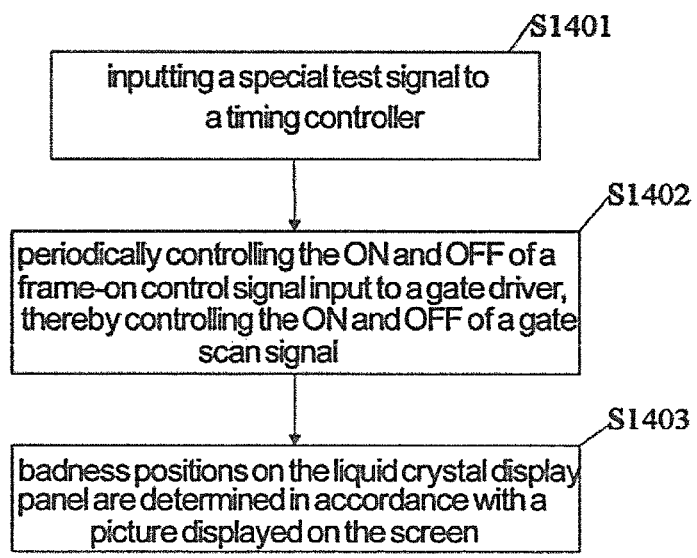
FIG. 14 is a flowchart of embodiment 1 of the test method for the liquid crystal cell according to the present invention.

As shown in FIG. 14, in the embodiment, the test method for the liquid crystal cell comprises:

S1401, inputting a special test signal into a timing controller; and

S1402, periodically controlling ON and OFF of a signal input to a gate driver, thereby controlling ON and OFF of a gate scan signal.

In particular, a frame-on control signal input to the gate driver is controlled to be ON and OFF by a square wave signal. When the square wave signal is at high level, the frame-on control signal is controlled to be input to the gate driver, and when the square wave signal is at low level, the frame-on control signal is controlled to be turned off. The square wave signal is V1 as shown in FIG. 7, the frame-on control signal is V2 as shown in FIG. 7, and a cycle of V1 is larger than that of V2. V2' is a signal input to the gate driver which is subjected to the control of V1, and $V_S$ is a gate scan signal output from the gate driver to each of the gate scan lines.

As can be seen, when V1 is at high level, the gate driver can generate a gate scan signal and output it to the gate scan line; and when V1 is at low level, the gate driver can not output any gate scan signal.

In this embodiment, while the gate scan signal is being controlled periodically to be ON and OFF, the L0 gray scale picture signal is input to the source driver after the test signal is modulated by the timing controller. Consequently, the source driver drives the pixel units in the liquid crystal display panel with the L0 gray scale picture signal.

S1403, determining badness positions on the liquid crystal display panel in accordance with the picture displayed on the screen.

Figure 8:
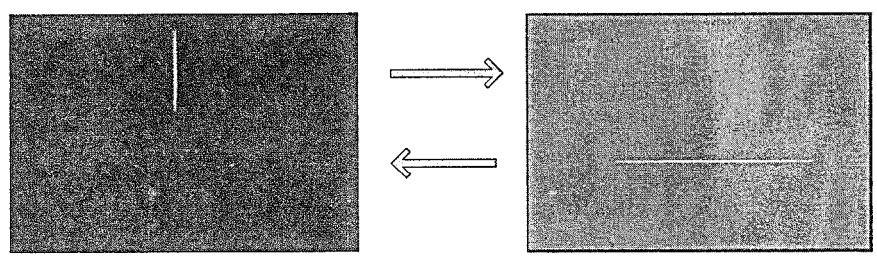
FIG. 8 is a picture displayed when testing DGS badness for the L0 gray scale picture in embodiment 1 of the test apparatus for the liquid crystal cell according to the present invention.

If there is DGS badness in the liquid crystal display panel of the liquid crystal cell, a picture as shown in the left figure of FIG. 8 will appear during the test, wherein the line with a gradually changed brightness represents a position of the data line in which the DGS badness locate. When the frame-on control signal is controlled to be turned off such that the gate driver can not output a gate scan signal to external, since the TFTs of respective pixels are in a turned-off state, the pixel electrodes can not be charged or discharged and thus are in a maintained state. The voltage of the gate scan line in which the DOS badness locates rises up due to the influence of the short circuit of the data line grey scale signal, which causes the TFT in that line turned on partially and the leak current is larger than that in the neighbor pixel units. Accordingly, a white or offwhite line or gradually changed whit or offwhite line will be formed, as shown in the right figure of FIG. 8. Due to the periodic control on the output of the gate scan signal and a visual staying phenomenon, a bright line in a longitudinal direction and a white line in a transverse direction can be seen on the screen at the same time. Now, the operator can find the positions of DGS badness by determining the abscissa of the bright line in the longitudinal direction and the ordinate of the white line in the transverse direction or using other locating means.

In particular, various badness of the liquid crystal display panel should be tested by using different test signals. For example, as for a "chessboard Mura" badness of the liquid crystal display panel, the method embodiment 1 according to the present invention can also be used in the test. For example, a L127 gray scale picture signal is input to the source driver to perform the test, and the screen display is as shown in the left figure of FIG. 9; and when the gate scan signal is turned off by the switch control unit, the test result displayed on the screen is as shown in the right figure of FIG. 9. By controlling ON and OFF of the gate scan signal periodically, the positions of the "chessboard Mura" badness can be fairly determined as a result of the alternation of the pictures in the left and right figures and the visual staying phenomenon. Therefore, in addition to badness positions, badness types of the liquid crystal display panel can also be tested by the present embodiment. As badness of different types will show different pictures on the screen, other badness of the liquid crystal display panel can also be tested by the present invention.

Method Embodiment 2

Figure 15:
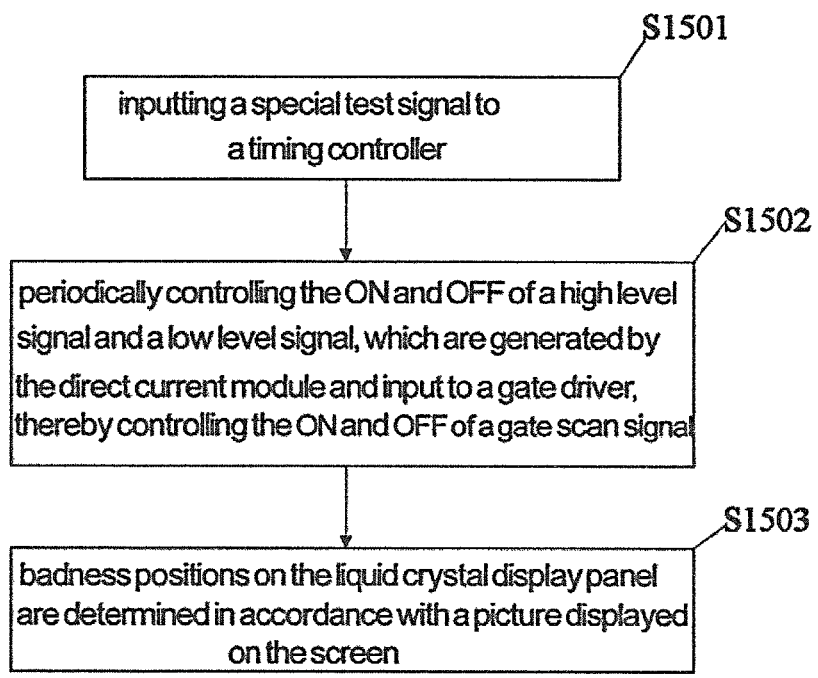
FIG. 15 is a flowchart of embodiment 2 of the test method for the liquid crystal cell according to the present invention.

As shown in FIG. 15, in present embodiment, a test method for the liquid crystal cell comprises:

S1501, inputting a special test signal to a timing controller; and

S1502, periodically controlling ON and OFF of a high level signal and a low level signal, which are generated by the direct current module and input to a gate driver, thereby controlling ON and OFF of a gate scan signal. In particular, the high and low level signals input to the gate driver are controlled to be turned on or off by a square wave signal. When the square wave signal is at high level, the high and low level signals generated by the direct current module are controlled to be input to the gate driver, and when the square wave signal is at low level, the high and low level signals generated by the direct current module are controlled to be turned off. FIG. 12 is a schematic diagram of the square wave signal and the high level signal V3 and the low level signal V4 input to the gate driver. As can be seen, when V1 is at high level, V3 and V4 are input to the gate driver, and thus a output terminal of the gate driver can output a gate scan signal to the gate scan line; and when V1 is at low level, V3 and V4 are turned off, and correspondingly, the output terminal of the gate driver can not output the gate scan signal to external. V3' and V4' are signals input to the gate driver which are subjected to the control of V1, and $V_S$ is a gate scan signal output from the gate driver to each of the gate scan lines.

While the gate scan signal is being controlled periodically to be ON and OFF, the L0 gray scale picture signal is input to the source driver after the test signal is modulated by the timing controller. Consequently, the source driver drives the pixel units in the liquid crystal display panel with the L0 gray scale picture signal.

S1503, determining badness positions on the liquid crystal display panel in accordance with the picture displayed on the screen. If there is a DGS badness in the liquid crystal display panel, since the L0 gray scale picture signal is input to the source driver, the left and right figures of FIG. 8 will appear on the screen alternatively. As a result of a visual staying phenomenon, the specific positions of badness can be determined by determining the abscissa of the bright line in a longitudinal direction and the ordinate of the white line in a transverse direction or using other locating means.

The test method for the liquid crystal cell provided in the present invention is capable of showing badness positions on a test picture by inputting a test signal and controlling ON and OFF of a signal input to a gate driver thereby controlling ON and OFF of a gate scan signal. The method embodiment 1 of the present invention can further tests badness of other types in the liquid crystal display panel, for example a badness of the liquid crystal display panel which causes various non-uniform picture problems, by controlling ON and OFF of the frame-on control signal input to the gate driver.

The above descriptions are only the specific embodiments of the present invention, and the protection scope of the present invention is not limited thereto. Any changes or substitutions which can be conceived easily by those skilled in the art are within the technical scope disclosed in the present invention, and shall fall into the protection scope of the present invention. So the protection scope of the present invention should be defined by the protection scope of the claims.

What is claimed is:

1. A test method for a liquid crystal cell, comprising:
   inputting a test signal;
   modulating the test signal and outputting a gray scale picture signal; and
   controlling ON and OFF of a gate scan signal by controlling ON and OFF of a control signal input to a gate driver, so as to determine badness positions on a liquid crystal display panel;
   wherein ON and OFF of said control signal input to the gate driver is controlled by a square wave signal, wherein said control signal is input to said gate driver when said square wave signal is at high level, and said control signal is turned off when said square wave signal is at low level, wherein the gray scale picture signal is input to a source driver while the gate scan signal is being controlled periodically to be ON and OFF, so as to determine the badness positions according to different patterns displayed on the liquid crystal display panel under a status in which the gate scan signal is ON and under a status in which the gate scan signal is OFF respectively.

2. The test method for the liquid crystal cell of claim 1, wherein said control signal input to said gate driver is a frame-on control signal,
   periodically controlling ON and OFF of the frame-on control signal input to the gate driver, so as to control ON and OFF of the gate scan signal accordingly; and
   determining badness positions on the liquid crystal display panel in accordance with a pattern displayed on a screen.

3. The test method for the liquid crystal cell of claim 2, wherein said periodically controlling ON and OFF of the frame-on control signal input to the gate driver comprises:
   controlling ON and OFF of the frame-on control signal input to the gate driver by the square wave signal, wherein said frame-on control signal is input to said gate driver when said square wave signal is at high level, and said frame-on control signal is turned off when said square wave signal is at low level.

4. The test method for the liquid crystal cell of claim 3, wherein a cycle of said square wave signal is larger than that of said frame-on control signal.

5. The test method for the liquid crystal cell of claim 1, wherein said control signal input to said gate driver comprises high and low level signals generated by a direct current module:
   controlling ON and OFF of the high and low level signals generated by said direct current module so as to control ON and OFF of the gate scan signal accordingly; and
   determining badness positions on the liquid crystal display panel in accordance with a pattern displayed on a screen.

6. The test method for the liquid crystal cell of claim 5, wherein controlling ON and OFF of the high and low level signals generated by said direct current module by the square wave signal;
   said high and low level signals generated by said direct current module are input to said gate driver when said square wave signal is at high level; and
   said high and low level signals generated by said direct current module are turned off when said square wave signal is at low level.

* * * * *